United States Patent [19]

Jakob et al.

[11] Patent Number: 5,243,131
[45] Date of Patent: Sep. 7, 1993

[54] HOUSING FOR AN ELECTRONIC CIRCUIT

[75] Inventors: Gert Jakob, Stuttgart; Willy Bentz, Sachsenheim; Dieter Hussmann, Steinheim; Peter Schiefer, Abstatt; Dieter Karr, Tiefenbronn, all of Fed. Rep. of Germany

[73] Assignee: Robert Bosch GmbH, Stuttgart, Fed. Rep. of Germany

[21] Appl. No.: 689,815

[22] PCT Filed: Sep. 28, 1990

[86] PCT No.: PCT/DE90/00744

§ 371 Date: May 17, 1991

§ 102(e) Date: May 17, 1991

[87] PCT Pub. No.: WO91/05453

PCT Pub. Date: Apr. 18, 1991

[30] Foreign Application Priority Data

Oct. 4, 1989 [DE] Fed. Rep. of Germany ....... 3933084

[51] Int. Cl.$^5$ ............................................. H05K 5/00
[52] U.S. Cl. ................................. 174/52.1; 361/688; 361/730; 361/736
[58] Field of Search ............... 361/381, 383, 384, 386, 361/388, 389, 390, 394, 395, 399; 174/52.1, 252, 255; 439/76, 78

[56] References Cited

U.S. PATENT DOCUMENTS

| 3,348,148 | 10/1967 | Parsons et al. | 361/386 |
| 4,138,711 | 2/1979 | Bremenour et al. | 361/424 |
| 4,409,641 | 11/1983 | Jakob et al. | |
| 4,471,407 | 11/1984 | Sleder | |
| 4,811,165 | 3/1989 | Currier et al. | 361/386 |
| 4,858,071 | 8/1989 | Manabe et al. | 361/386 |

FOREIGN PATENT DOCUMENTS

| 2546334 | 4/1977 | Fed. Rep. of Germany |
| 3020902 | 12/1981 | Fed. Rep. of Germany |
| 2328353 | 5/1977 | France |
| 2483730 | 4/1981 | France |
| 1552317 | 9/1979 | United Kingdom |

Primary Examiner—Leo P. Picard
Assistant Examiner—Bot Ledynh
Attorney, Agent, or Firm—Michael J. Striker

[57] ABSTRACT

The housing for an electronic circuit provided with a connection plug, particularly for control device electronics of an internal combustion engine of a vehicle, includes a cooling frame to which a printed circuit board having the electronic circuit is fastened and which has at least one cooling portion with which power components connected to the printed circuit board are connected so as to conduct heat, and also includes a cover enclosing the printed circuit board. For a simple construction, it is suggested that the cooling frame (5) be constructed as a flat frame (6) with flat frame legs (8, 8a, 8b, 8c, 8d) substantially parallel to the plane (7) of the printed circuit board (3), the housing cover pieces (12, 13) forming the cover (11) being arranged at the upper and lower sides (9, 10) of the flat frame (6).

16 Claims, 9 Drawing Sheets

HOUSING FOR AN ELECTRONIC CIRCUIT

BACKGROUND OF THE INVENTION

The invention is directed to a housing for an electronic circuit provided with a connection plug, particularly for control device electronics of an internal combustion engine of a vehicle, comprising a cooling frame to which a printed circuit board comprising the electronic circuit is fastened and which has at least one cooling portion with which power components connected to the printed circuit board are connected so as to conduct heat, and comprising a cover enclosing the printed circuit board.

Such a housing is known from DE-PS 25 46 334. The housing has comprises a cooling frame which carries a board and chambers for receiving components to be cooled - such as load resistors. The cooling frame is further provided in part with a base on which components of a power stage which generate a relatively high level of heat are located. The base extends parallel to the plane of the printed circuit board, i.e. it lies at a right angle to the side walls of the cooling frame. A receiving clip, through which a connection plug projects, is fastened to the cooling frame so as to be detachable. A hood covers the printed circuit board, the hood being placed over the cooling frame having the printed circuit board and abutting with its edge against a sealing ring which is inserted in a guide groove of the receiving clip. The construction and design of the housing have proven successful, but are quite complicated, since the cooling frame requires a special section; therefore, this is a cost-intensive solution. Moreover, the heat elimination from the heat-generating components is in need of improvement for certain constructions.

SUMMARY OF THE INVENTION

In contrast, the housing, according to the invention has the advantage of a very simple and accordingly economical construction which enables very good dissipation of heat. The cooling frame is constructed, according to the invention, as a flat frame with flat frame legs lying substantially parallel to the plane of the printed circuit board. Such a flat frame is very simple to produce. A stamped sheet metal part is preferably used. Housing cover pieces forming the cover for the printed circuit board are fastened to the upper and lower sides of the flat frame. The flat frame carrying the printed circuit board is accordingly enclosed on both sides by a housing cover piece. These housing cover pieces, which are constructed in an approximately trough-shaped manner, are likewise simple to produce. Since the flat frame communicates with the housing cover pieces over a large surface area, a good dissipation of heat is ensured.

Holding tabs which face toward the frame interior preferably proceed from the flat frame for the purpose of fastening the printed circuit board. In particular, the holding tabs are constructed so as to be bent at right angles in such a way that the printed circuit board rests in a plane parallel to the flat frame legs at a distance from the latter. Accordingly, it is possible to provide sufficient space for a housing seal—to be described in more detail in the following—in spite of the smallest possible surface area.

According to a further development of the invention, at least one cooling portion, which is constructed as a bent cooling bracket, proceeds from at least one of the flat frame legs. The cooling bracket is at an angle, preferably 90°, to the plane of the printed circuit board. Accordingly, it is possible to mount components—particularly power components—generating a relatively high level of heat on the printed circuit board already during the production of the latter. The wherein the connection wires of the power components are soldered, with the conductor paths of the printed circuit board. A heat-removing connection to the cooling bracket is produced, when mounting the printed circuit board is mounted on the cooling frame. In particular, the housing of the power components comes into contact with the cooling bracket over a large surface area, so that there is relatively low heat transmission resistance.

It is advantageous if seal guide strips for a first, circumferentially extending seal assigned to one of the housing cover pieces are bent down from the flat frame legs. In particular, the seal guide strips are bent in the same direction as the respective area of the holding tabs which is bent at right angles. The seal guide strips form stops for fixing the seal.

According to a preferred embodiment example of the invention, guide tabs which extend at a right angle to the plane of the printed circuit board, receive the flat frame between them and project over the latter by a portion, in each instance extending from the other housing cover piece. The projecting portions, together with the seal guide strips, form a receiving channel for the first seal, which was already mentioned. Further, the projecting portions constitute a guide for one housing cover piece, so that the latter is aligned effortlessly during assembly.

In particular, it is provided that the other housing cover has a seal receiving groove for a circumferentially extending second seal which contacts the flat frame. Consequently, both the upper and lower sides of the flat frame are acted upon by a seal against which the two housing cover pieces abut.

The two housing cover pieces are constructed as deep-drawing sheet metal parts for the purpose of a simple construction In particular, it can be provided that the connection plug is fastened at a supporting piece which communicates with flat frame legs located opposite one another. The flat frame accordingly takes over a third function; because it not only carries the printed circuit board and, moreover, not only serves as cooling frame, but also provides an additional support of the connection plug connected with the electronic circuit. In particular, the supporting piece is supported on the sides of correspondingly arranged holding tabs, which sides are remote of the printed circuit board. Accordingly, the printed circuit board abuts against one side of these holding tabs and the other sides of the holding tabs are acted upon by the supporting piece.

For the purpose of a simple fastening and for eliminating the heat, the corner areas of the flat frame are penetrated by fastening bore holes which are aligned with corresponding bore holes in the two housing covers. The fastening means penetrating the fastening bore holes and serving for the assembly of the housing can accordingly conduct the heat given off at the flat frame or housing cover to corresponding fastening areas—for example, the body or chassis of the vehicle.

One of the housing cover pieces preferably has an opening for the connection plug. The connection plug, which is connected directly to the printed circuit board by its contacts, is accordingly accessible from the outside for the attachment of a corresponding socket part as a result of the opening. A seal is preferably arranged in the edge area of the opening, so that neither dirt nor moisture can reach the interior of the housing.

The power components are arranged so as to be separate from the rest of the electronics of the electronic circuit for improved thermal conditions.

BRIEF DESCRIPTION OF THE DRAWING

The invention is explained in more detail in the following with reference to the drawing.

DETAILED DESCRIPTION OF THE PREFERRED EMBODIMENTS

Figure 1:
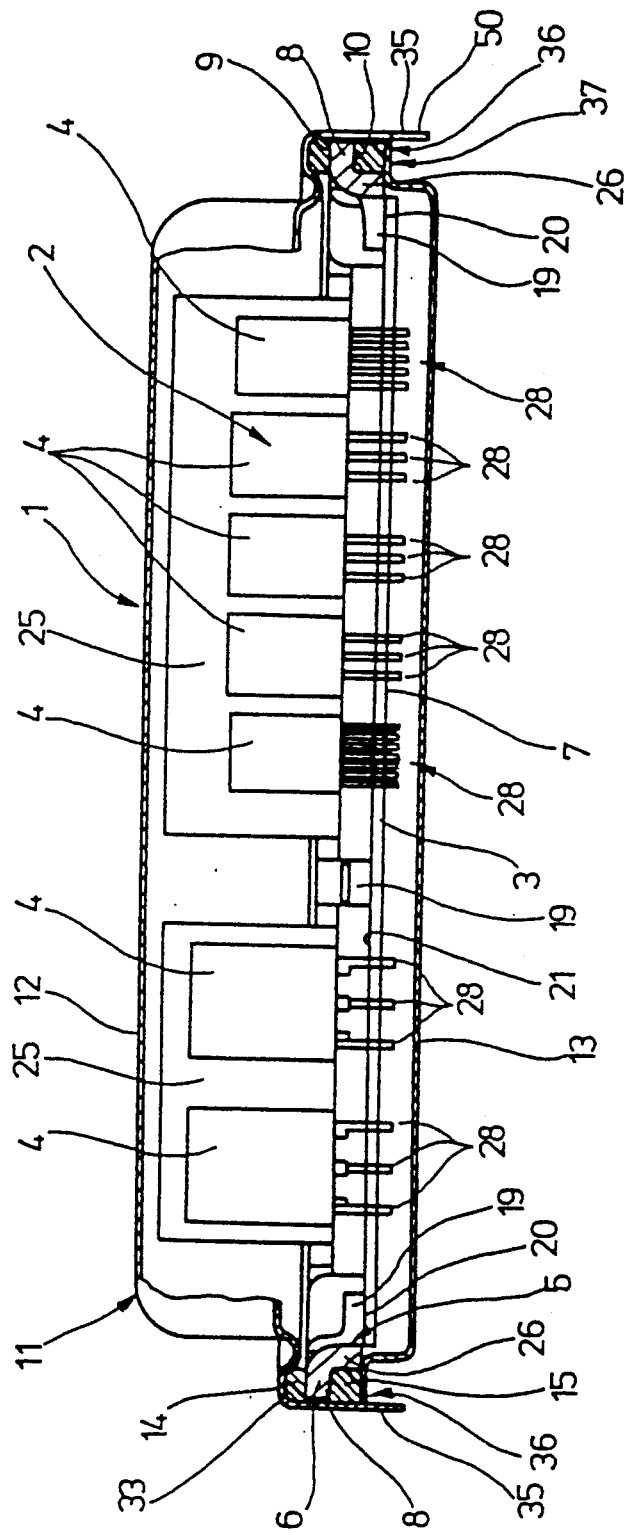
FIG. 1 is a sectional view through a housing for an electronic circuit according to the invention.

FIG. 1 shows a housing 1 for an electronic circuit 2 which is arranged on a printed circuit board 3. In particular, the electronic circuit 2 is a part of the control electronics of an internal combustion engine of a vehicle.

In addition to a plurality of structural component parts—not shown—the electronic circuit 2 comprises power components 4 which can be constructed e.g. as power transistors.

The housing 1 has a cooling frame 5 which is constructed as a flat frame 6 and has flat frame legs 8 which lie substantially parallel to the plane 7 of the printed circuit board 3. The flat frame 6 has a rectangular outline.

Housing, cover pieces 12 and 13, which enclose the printed circuit board 3 and form a cover 11 are mounted on the upper side 9 and lower side 10 of the flat frame 6 with intervening circumferentially extending seals 14 and 15.

Figure 2:
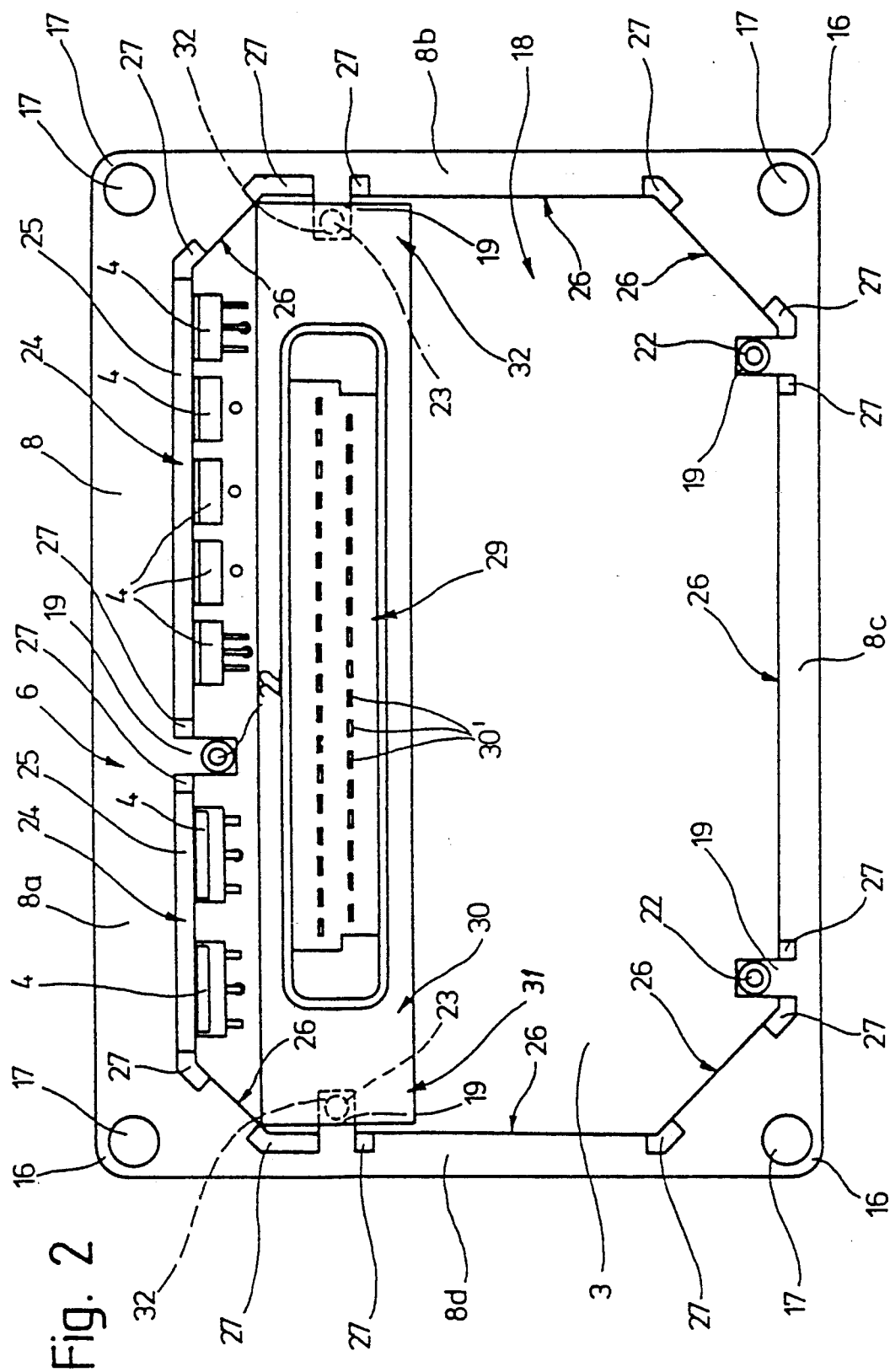
FIG. 2 is a top view of a flat frame of the housing of FIG. 1.

The construction of the flat frame 6 will first be discussed in the following. FIG. 2 shows that the flat frame 6 comprises a total of four flat frame legs 8 which are designated by 8a, 8b, 8c and 8d for better clarity. Fastening bore holes 17 are formed in the corner areas 16 of the flat frame 6. The flat frame 6 is constructed as a stamped sheet metal part, i.e. it is stamped out of sheet metal and, in so doing or subsequently, subjected to one or more bending processes. The latter will be discussed in more detail in the following.

Holding tabs 19 facing the frame interior 18 and serving for the fastening of the printed circuit board 3 proceed from the flat frame 6. The holding tabs 19 are bent at right angles, i.e., according to FIG. 1, they are first bent downward proceeding from the respective frame leg 8 and then bent in the opposite direction, so that their lower sides 20 extend parallel to the plane of the flat frame legs 8. The printed circuit board 3 lies with its upper side 21 against the undersides 20 of the holding tabs 19 and is fixed there by means of suitable fastening means (e.g. screws). Some of the holding tabs 19 have threaded bore holes 22 for this purpose; others are provided with throughbore holes 23.

Two cooling portions 24, which are constructed as cooling brackets 25 bent in the opposite direction of the holding tabs 19, proceed from the flat frame leg 8a. The cooling brackets 25 extend at a right angle to the plane 7 of the printed circuit board 3.

Figure 3:
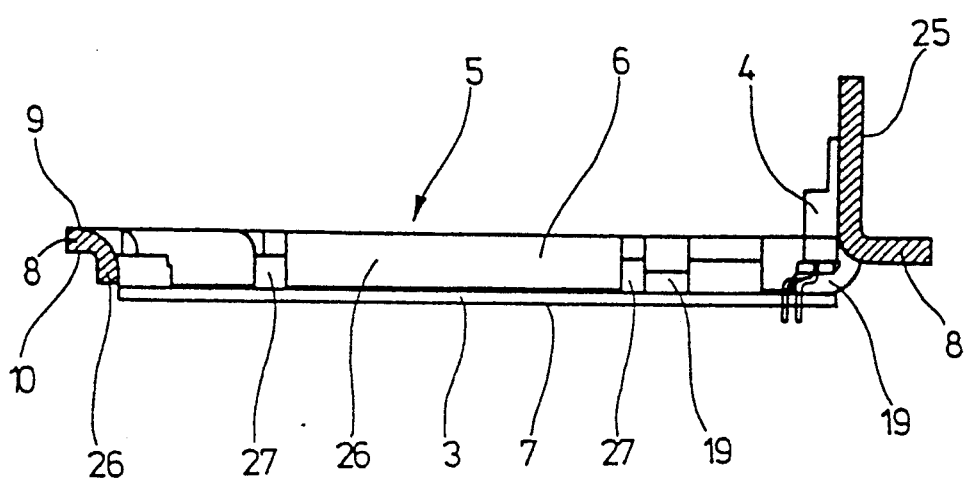
FIG. 3 is a cross section through the flat frame according to FIG. 2.

The flat frame legs 8b, 8c and 8d, as well as all corner areas 16, are provided with seal guide strips 26. The latter can be seen in particular from FIGS. 1 and 3. They are formed by areas of the inner edge of the flat frame 6 which are bent in the opposite direction of the cooling brackets 25. The seal guide strips 26 are defined laterally in each instance by cut out portions 27 at both sides. This is also true of the cooling brackets 25.

The arrangement is constructed in such a way that the power components connected with the conductor paths of the printed circuit board 3 by of their connection wires 28 occupy an upright position in such a way that their back sides, which serve to dissipate the heat, have a surface-area contact with the cooling brackets 25. In order to minimize the heat transmission resistance, the power components can be pressed securely against the cooling brackets 25 (not shown in FIGS. 1 to 3) by suitable metal spring clamps which are supported at the outer sides of the cooling brackets 25 on one side and at the power components on the other side.

It can be seen from FIG. 1 that the two housing cover pieces 12 and 13 are constructed in a trough-shaped manner. The housing cover piece 12 has hood-like arched portions which are constructed at both sides of a connection plug 29 penetrating the housing cover wall. They serve to receive the upright power components as well as the rest of the components, not shown, located on the upper side 21 of the printed circuit board 3 (this construction follows particularly from the further embodiment example of FIG. 4 which will be discussed in more detail in the following).

The connection plug 29 is soldered by its contacts 30' directly with the conductor paths of the printed circuit board 3. It penetrates an opening of a supporting piece 30 which is supported by its end areas 31 and 32 on the sides 32 of the holding tabs 19 proceeding from the flat frame legs 8b and 8d, which sides 32 are remote of the printed circuit board 3. The fastening of the supporting piece 30 is carried out by means of securing screws, whose heads contact the underside of the printed circuit board 3 and whose threaded shafts penetrate corresponding bore holes 23 of the printed circuit board as well as the through-bore holes 23 of the holding tabs 19, in that the threaded shafts of these screws are screwed into corresponding threaded bore holes of the supporting web 30. The supporting piece 30 itself is connected in turn with the housing of the connection plug 29 via a plurality of screw connections. The aforementioned threaded bore holes of the supporting piece 30 are preferably arranged in small projecting supports which are constructed at its underside and which rest on the corresponding holding tabs 19.

It follows from FIG. 1 that the housing cover piece 12, which, like the housing cover piece 13, is constructed as a deep-drawing sheet metal part, comprises a stamped or shaped, substantially circumferentially extending seal receiving groove 33. The latter receives the seal 14 which is supported on the upper side 9 of the flat frame 6. The side edge 34 of the housing cover piece 12, which extends at a right angle to the plane 7 of the printed circuit board 3, has—outside the corner areas—guide tabs 35 which overlap the front ends 36 of the housing cover piece 13. The side edge 34 projects over the flat frame with portions 50.

A receiving duct 37 is constructed between the outer sides of the seal guide strips 26 and the insides of the guide tabs 35 for the seal 15 which contacts the underside 10 of the flat frame 6 on one side and contacts the edge area of the housing cover piece 13 which is bent at right angles on the other side.

Bore holes which are aligned with the fastening bore holes 17 of the flat frame 6 are constructed in the corner areas of the housing cover pieces 12 and 13. Accordingly, the housing cover piece 12, flat frame 6 and housing cover 13 can be clamped with one another by suitable fasteners accompanied by pressing the seals 14 and 15. Hollow-type rivets, for example, can be used as fastening means, which hollow-type rivets are in turn penetrated by suitable fasteners to secure the housing at the chassis or at the body of a motor vehicle.

In order to obtain a dust-free and water-tight construction, a sealing of the opening of the housing cover piece 12 which is penetrated by the connection plug 29 is also effected.

Figure 4:
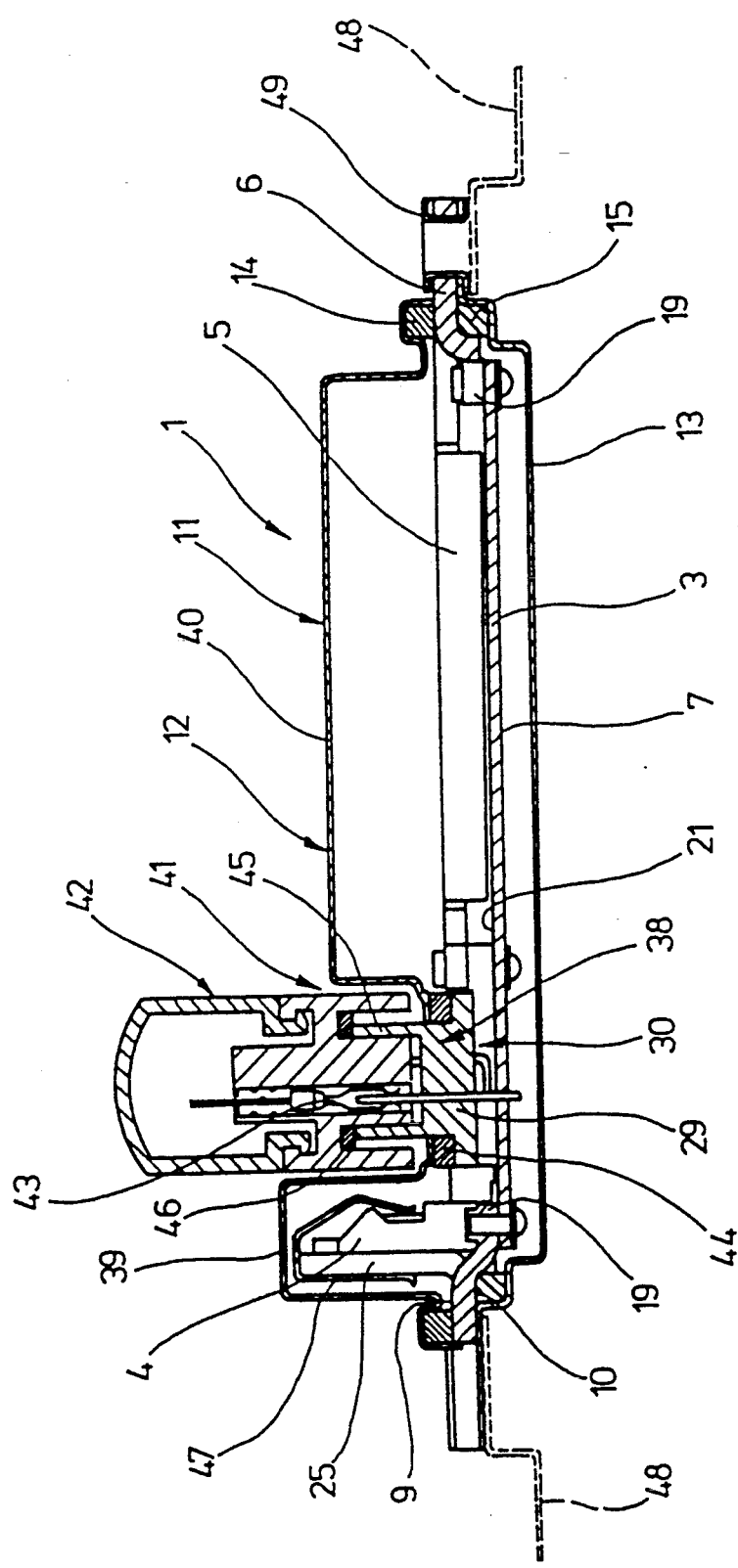
FIG. 4 is a longitudinal section through another embodiment example of a housing according to the invention.
Figure 5:
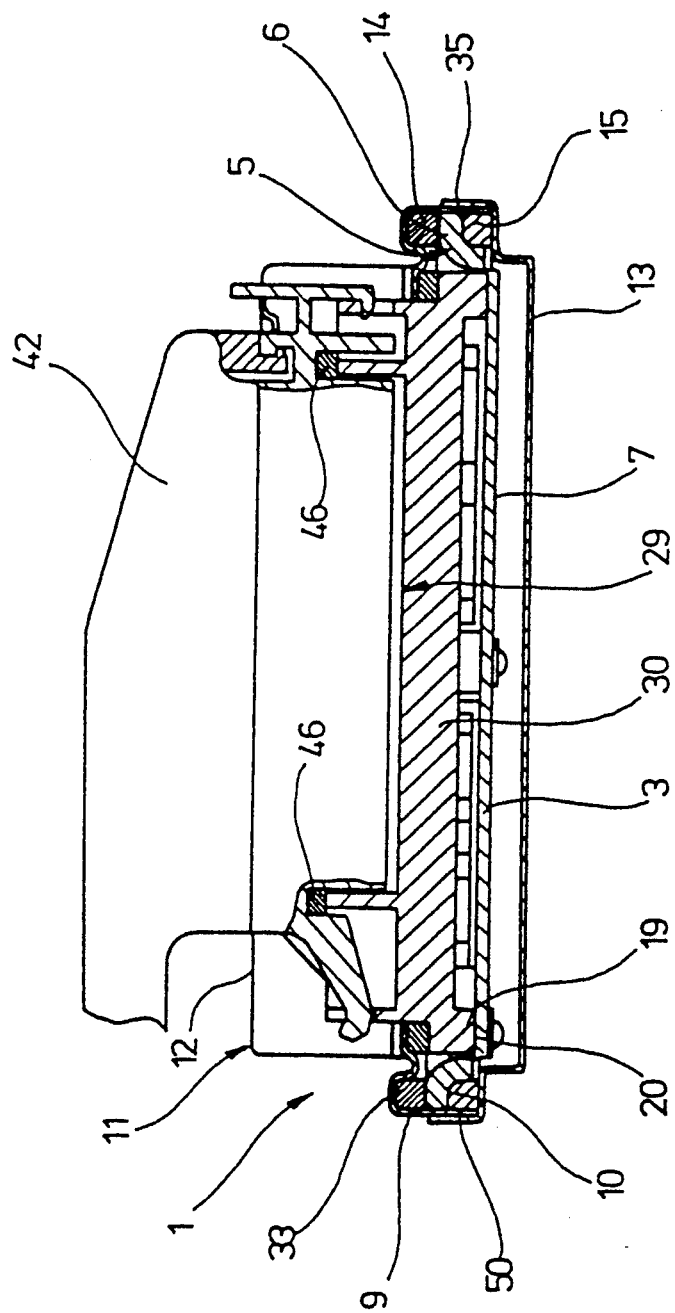
FIG. 5 is a cross section through the housing according to FIG. 4.
Figure 6:
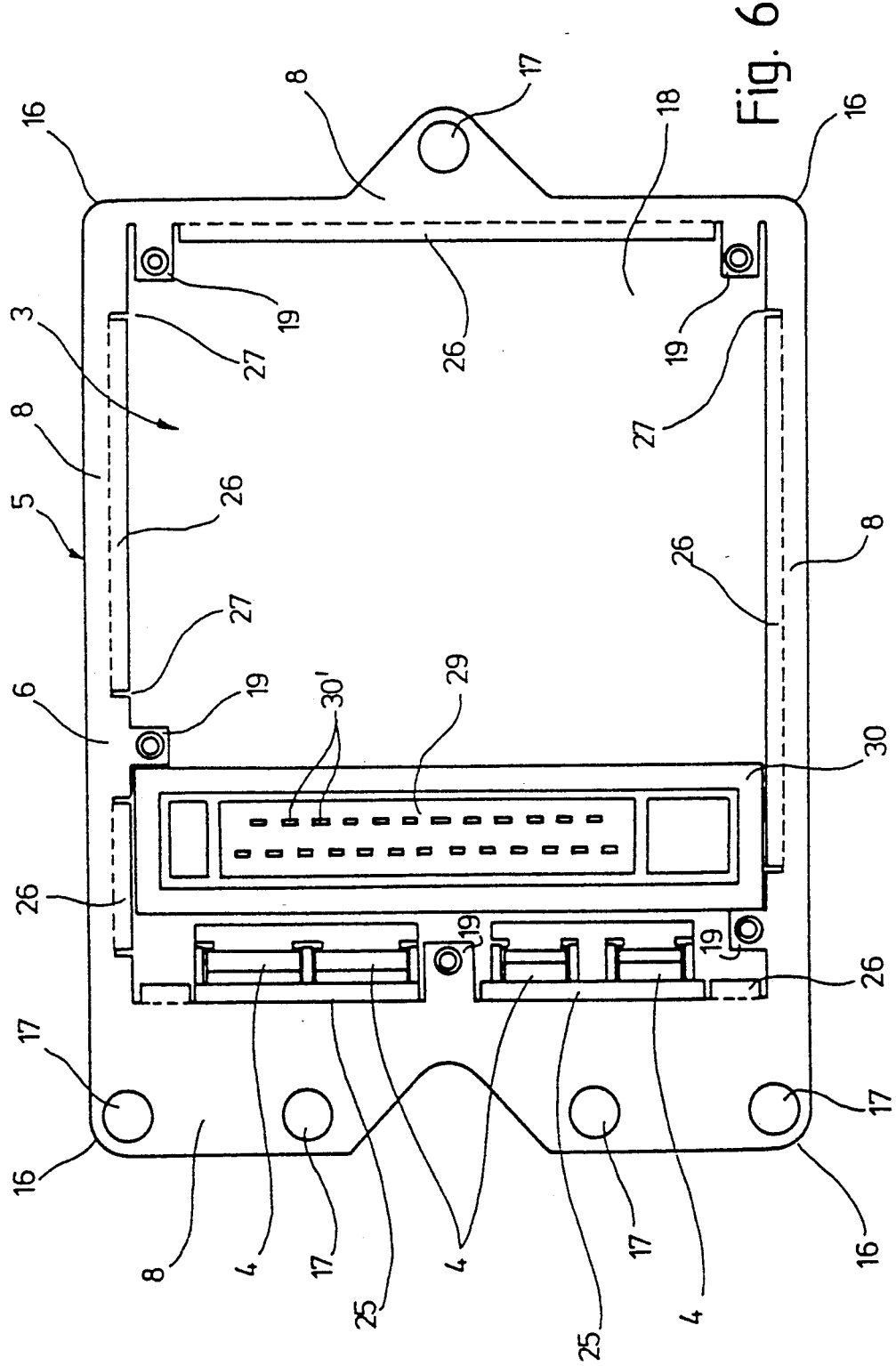
FIG. 6 is a top view of a flat frame of the embodiment example according to FIG. 4.

FIGS. 4 to 6 shows another embodiment example of a housing, according to the invention, wherein identical parts are provided with the same reference numbers. FIG. 4 clearly shows the two hood-shaped arched portions 39 and 40 of the housing cover piece 12. It also shows an area 41 which lies lower between the curved portions 39 and 40 and which has the opening 38 for the connection plug 29. A socket part 42 is also shown which is connectable with the connection part 29 and has counter-contacts 43 which cooperate with the contacts 30'. Finally, the seal 44 arranged between the connection plug 29 and the housing cover piece 12 can also be seen. Another seal is effected in that a circumferentially extending web wall 45 of the connection plug 29 cooperates with a seal 46 of the socket part 42.

FIG. 4 also shows the aforementioned metal spring clamps 47 with which the power components 4 are pressed against the cooling brackets 25. Further, fastening angles 48 which can be used under certain conditions and serve to fasten the housing at a desired location are drawn in FIG. 4 in dashed lines. Moreover, a hollow-type rivet 49 which penetrates the corresponding fastening bore holes 17, as well as the respective bore holes of the housing cover pieces 12 and 13, is also shown.

FIG. 6 shows that the supporting frame 6 shown here differs from the embodiment example of FIG. 2 in the shape of its outline. However, the rest of the construction corresponds in principle to that of the embodiment example described in the preceding, so that further description is unnecessary.

Figure 7:
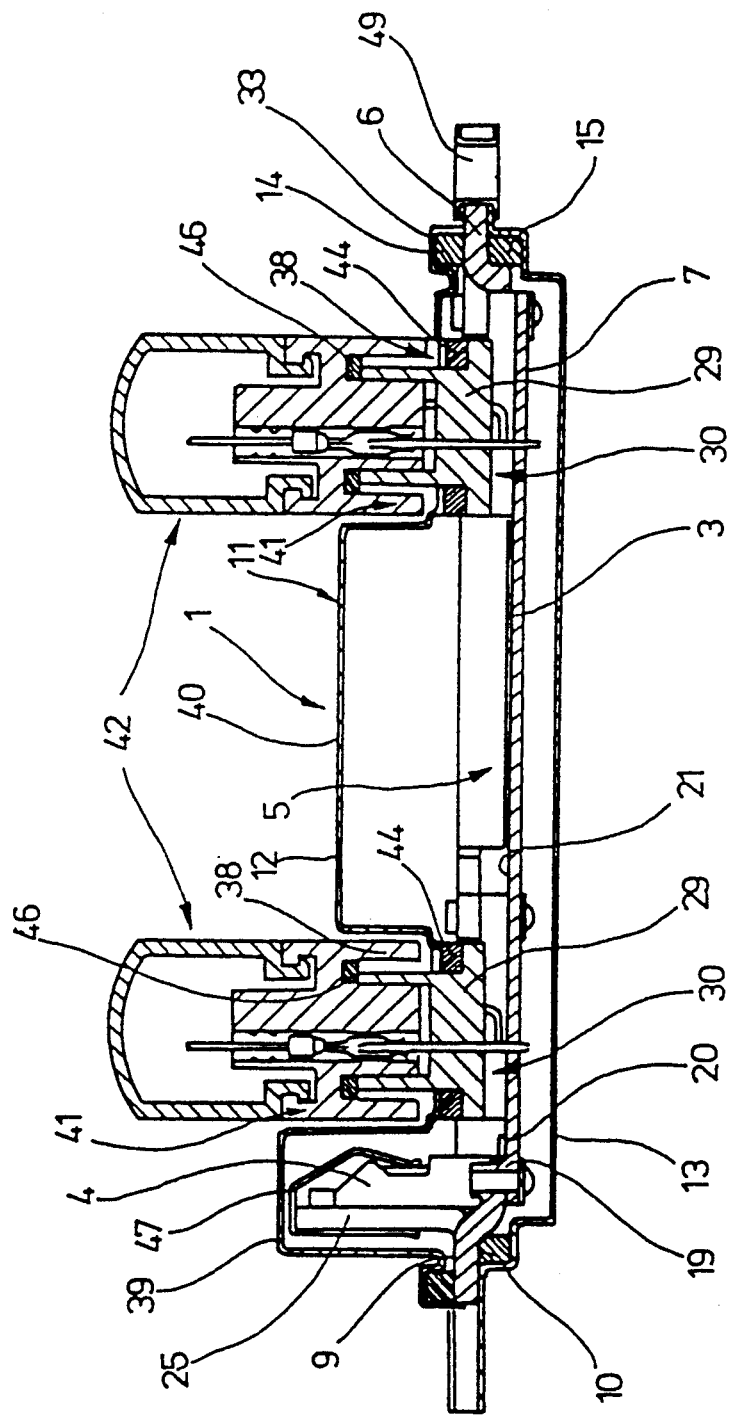
FIG. 7 is another embodiment example of a housing comprising two connection plugs.
Figure 8:
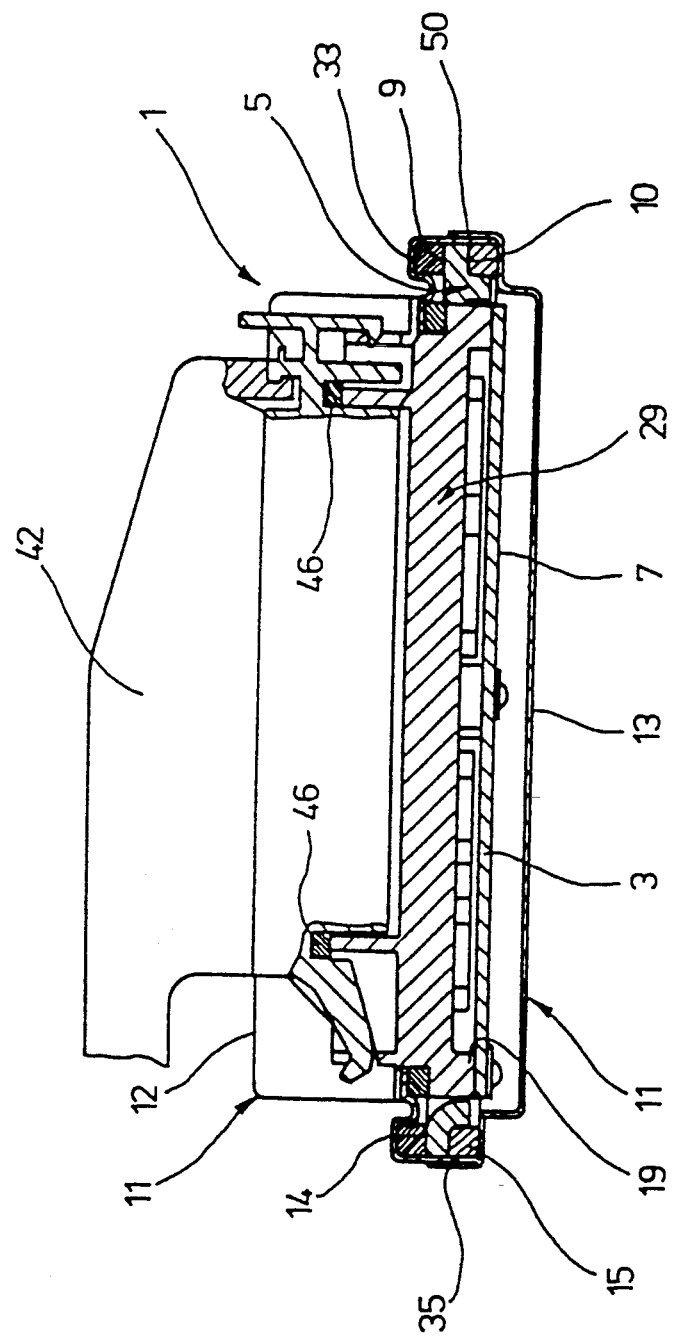
FIG. 8 is a cross section through the housing according to FIG. 7.
Figure 9:
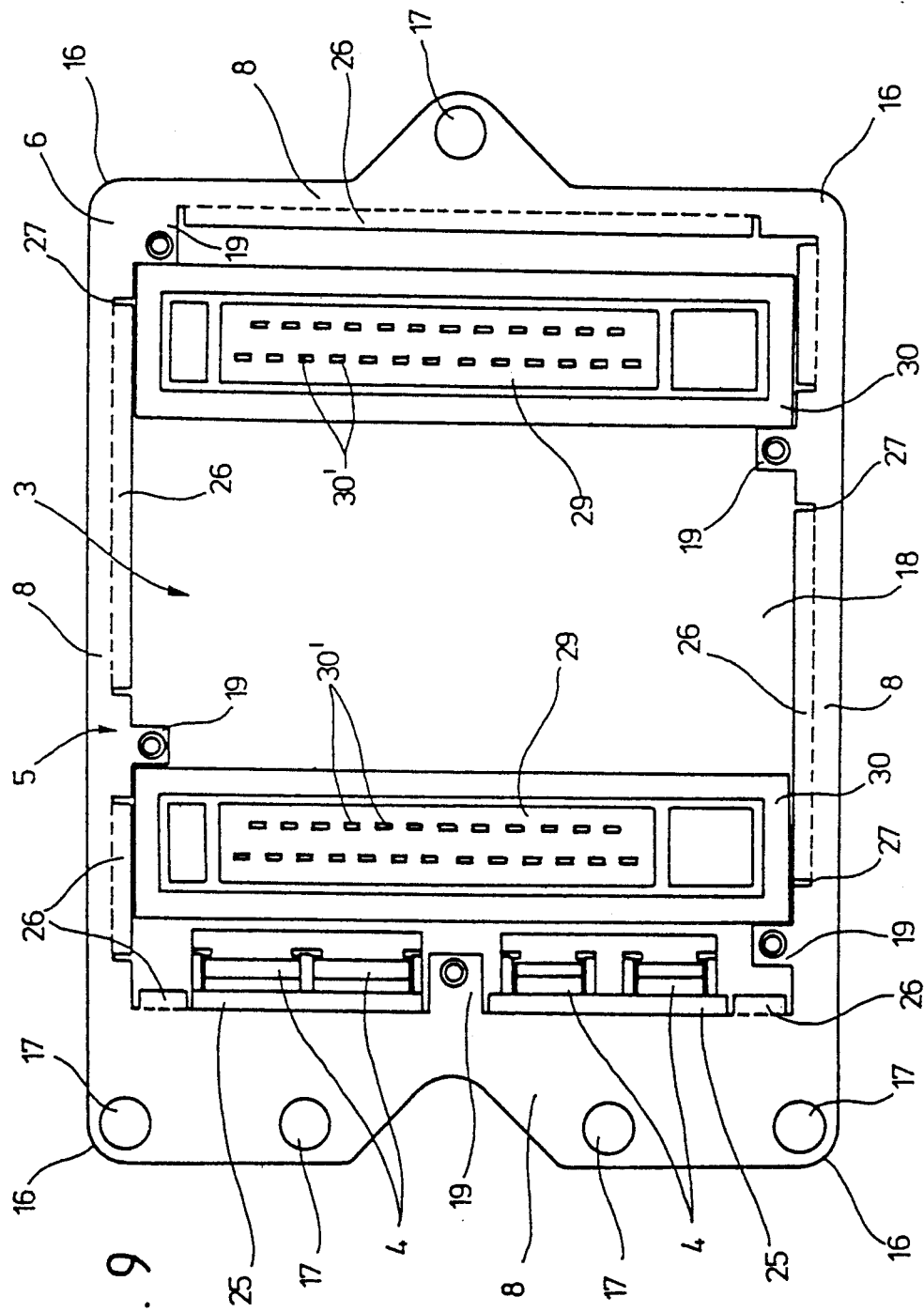
FIG. 9 is a top view of a flat frame of the embodiment example of FIG. 7.

Another embodiment example of the invention which corresponds to the embodiment example described above, but has two connection plugs 29 with corresponding socket parts 42 is shown in FIGS. 7 to 9.

As a result of the construction, according to the invention, the flat frame 6 of the described embodiment examples serves as a carrier for the printed circuit board 3, the connection plug or plugs 29, the seals 14 and 15, and as a heat sink for the heat losses of the power components 4. Because of the construction, according to the invention, no mechanical loads occur at the soldering points of the electronic circuit. A good heat conduction of the power components 4 results by means of the construction of the flat frame 6 with cooling brackets 25 as well as the corresponding connection with the housing cover pieces 12 and 13. A construction which is sealed against dust and moisture can be achieved in a simple manner by means of the described seals. If the control device is mounted in the vehicle interior, the seals can be dispensed with. In particular, the arrangement of the connection plug 29 is selected in such a way that the power components lie on one side of it and the remaining electronics lie on the other side. This results in advantages because of reduced disturbing influence of the power components 4 on the rest of the electronics, the influence of the heat of the power components on the rest of the electronics is reduced and the arrangement of the lines on the printed circuit board 3 is simplified. As a result of the fastening of the housing 1, according to the invention, at the body or the chassis of a vehicle, a more direct conduction of heat can be effected. If necessary, the fastening can be effected with additional elements specifically relating to installation (e.g. fastening angles 41).

While the invention has been illustrated and described as embodied in a housing for an electronic circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the printed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower sides (9, 10) of the flat frame (6).

2. The improvement according to claim 1, wherein the flat frame (6) is a stamped sheet metal part.

3. The improvement according to claim 1, further comprising a circumferentially extending first seal (15) associated with one of the housing cover pieces (13) and seal guide strips (26) bent down from the flat frame legs (8, 8a, 8b, 8c, 8d) for the alignment of the circumferentially extending first seal (15).

4. The improvement according to claim 1, wherein the other housing cover piece (12) has a circumferentially extending second seal (14) and seal receiving groove (33) for said second seal (14), said second seal (14) contacting the flat frame (6).

5. The improvement according to claim 1, wherein the two housing covers (12, 13) are deep-drawn sheet metal parts.

6. The improvement according to claim 1, wherein the flat frame (6) has corner areas (16) and the corner areas (16) are provided with throughgoing bore holes (17) for fastening, said bore holes being aligned with bore holes provided in the two housing cover pieces (12, 13).

7. The improvement according to claim 1, wherein one of the housing cover pieces (12) is provided with an opening (38) for the connection plug (29).

8. The improvement according to claim 1, wherein the power components (4) are arranged separately from other components of the printed circuit.

9. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the pointed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower sides (9, 10) of the flat frame (6), the flat frame has a frame interior (18) and further comprising holding tabs (19) for fastening the printed circuit board (3) extending from the flat frame (6), said holding tabs facing into the frame interior (18).

10. The improvement according to claim 9, further comprising a supporting piece (30) connected to opposite flat frame legs (8b, 8d), said connection plug (29) being fastened to said supporting piece (30).

11. The improvement according to claim 10, wherein the supporting piece (3) is supported on sides (32) of the holding tabs (19), said sides (32) being remote to the printed circuit board (3).

12. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the pointed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower sides (9, 10) of the flat frame (6), the holding tabs (19) are bent at right angles in such a way that the printed circuit board (3) is oriented in a plane which is substantially parallel to the flat frame legs (8, 8a, 8b, 8c, 8d) and spaced a distance from the flat frame legs.

13. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the pointed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower sides (9, 10) of the flat frame (6), the at least one cooling portion (24) is constructed as a bent cooling bracket (25) and proceeds from at least one of the flat frame legs (8, 8a, 8b, 8c, 8d).

14. The improvement according to claim 13, wherein the cooling bracket (25) extends substantially at a right angle to the plane (7) of the printed circuit board (3).

15. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the pointed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower sides (9, 10) of the flat frame (6), and a circumferentially extending first seal (15) associated with one of the housing cover pieces (13) and seal guide strips (26) bent down from the flat frame legs (8, 8a, 8b, 8c, 8d) for the alignment of the circumferentially extending first seal (15), the seal guide strips (26) are bent in the direction of the holding tabs (19) which are bent at right angles.

16. A printed circuit board assembly, comprising a printed circuit board having an electronic circuit provided with power components and a connection plug, and a cooling frame to which the printed circuit board having the electronic circuit is fastened and which has at least one cooling portion, to which the power components connected to the printed circuit board are connected so as to conduct heat, and also comprising a cover enclosing the printed circuit board, the improvement wherein the cooling frame (5) is a substantially flat recessed frame (6) on which the pointed circuit board (3) is mounted and which includes flat frame legs (8, 8a, 8b, 8c, 8d) oriented substantially parallel to a plane (7) of the printed circuit board (3), and the cover (11) comprises housing cover pieces (12, 13) each of which is mounted on one of the upper and lower side (9, 10) of the flat frame (6), and a plurality of guide tabs (35) extending at a right angle to the plane (7) of the printed circuit board (3) and from the other housing cover piece (12), said guide tabs receiving the flat frame (6) between themselves and projecting over the flat frame (6) by a portion (50).

* * * * *